US007682157B2

(12) United States Patent
Wang et al.

(10) Patent No.: US 7,682,157 B2

(45) Date of Patent: Mar. 23, 2010

(54) CARD EDGE CONNECTOR

(75) Inventors: Jianming Wang, Shenzhen (CN); Chingshun Su, Taiwan (TW)

(73) Assignee: Shenzhen Linkconn Electronics Co., Ltd., Shenzhen (CN)

(*) Notice: Subject to any disclaimer, the term of this patent is extended or adjusted under 35 U.S.C. 154(b) by 0 days.

(21) Appl. No.: 12/330,121

(22) Filed: Dec. 8, 2008

(65) Prior Publication Data

US 2010/0015820 A1 Jan. 21, 2010

(30) Foreign Application Priority Data

Jul. 17, 2008 (CN) ........................ 2008 1 0068561

(51) Int. Cl.
*H01R 12/00* (2006.01)
*H05K 1/00* (2006.01)

(52) U.S. Cl. ........................................................ 439/59

(58) Field of Classification Search ................... 439/59, 439/630, 637; 235/441
See application file for complete search history.

(56) References Cited

U.S. PATENT DOCUMENTS 6,162,069 A * 12/2000 Choy .......................... 439/92
6,464,514 B1 * 10/2002 Tsai et al. ...................... 439/92
6,817,875 B2 * 11/2004 Chang et al. ................ 439/159
7,048,565 B2 * 5/2006 Lin ............................ 439/326
7,074,067 B2 * 7/2006 Yang et al. .................. 439/326

* cited by examiner

*Primary Examiner*—Javaid Nasri
(74) *Attorney, Agent, or Firm*—Hamre, Schumann, Mueller & Larson, P.C.

(57) ABSTRACT

The present invention provides a card edge connector. The card edge connector comprises a bar insulator base which is provided with a plurality of sockets, a group of connecting terminals arrayed in parallel, and two arm base supports arranged between both ends of the insulator base. The connecting terminals are inserted into the sockets of the insulator base to constitute a group of socket electrodes electrically connected with a circuit board. The arm base supports are respectively provided with an auxiliary supporting bracket connected with the circuit board. Each auxiliary supporting bracket is mutually sheathed, articulated and connected with one respective arm base support.

8 Claims, 8 Drawing Sheets

CARD EDGE CONNECTOR

TECHNICAL FIELD

The present invention relates to connector structures in electronic products and, more particularly to a card edge connector, which is used for fixing a flat or strap electronic card.

BACKGROUND

With the development of electron technology, various flat or strap electronic cards are widely applied into electronic equipments (such as electronic communication equipments and computers, etc.). The electronic cards may be connected to each other via the card edge connector. The connecting terminal on the connector is connected to the circuit board via the welding pin. Simultaneously, the connector is used to fix the electronic cards. At present, a traditional connector essentially comprises: a bar insulator body base provided with a plurality of sockets, a group of connecting terminals arrayed in parallel, and two arm supports which are arranged between both ends of the insulator base and are used for fixing the connector. The connecting terminals are respectively provided with a contact part which can be arranged in the socket of the insulator base. The welding pin arranged at the lower end of the contact part extends out of the insulator base and is electrically connected with the circuit board to constitute a group of socket electrodes of the connector. The arm supports, as metal pieces, comprises a baseplate. One end of the arm supports is securely connected to both ends of the insulator base, while the other end of arm supports is a free end. The bottom of the arm supports is downwardly extended with a soleplate fixedly connected to the circuit board. In the manufacturing and assembly of the connector, the soleplates of the connecting terminal and the arm supports are welded on the circuit board by virtue of the surface welding technology. When in welding, all the welding points on the connector are required on the same plane so as to ensure the welding quality. In fact, as the insulator base, which is a strip component, tends to twist and deform in the transferring and assembly process of components, the two arm supports connected to the insulator base hardly ensure that both the soleplates are on the same plane. Consequently, a flatness error is caused between the welding surface and some welding points of the soleplates of the arm supports, which results in poor welding of the welding points.

To solve these above problems, a conventional approach is that the arm supports are additionally provided with an auxiliary supporting bracket respectively. The bottom of the auxiliary supporting bracket is welded with the circuit board. A certain vertical clearance is designed between the arm supports and the auxiliary supporting bracket, thereby forming a matching form by floating up and down, so as to eliminate the error between the bottom surfaces of the two auxiliary supporting brackets and the welding pin of the connecting terminal. In this way, the above problems are solved. Although the structure can meet the requirement that the welding points of the auxiliary supporting brackets and the welding pin of the connecting terminal are on the same plane. However, the clearance of relatively up and down motion between the auxiliary supporting brackets and the arm supports actually ensures that the auxiliary supporting brackets become supporting structure that can float upwardly and downwardly and the connection between the arm supports and the insulator base is a floating connection. Partial external force of the connecting terminal generated during the insertion and extraction of the electronic cards is transmitted through the arm supports to the welding pin on the connecting terminal and the connecting point of the circuit board. The operation can result in shake of the insulator base. Further, the downward pushing, bounce and shake of the electronic card can directly affect the connecting terminal at back end, which greatly affects the connecting stability and reliability of the connector, farther affects the using performance of the connecting terminal.

SUMMARY

An object of an embodiment of the invention the present invention is to provide a card edge connector, for solving the problem mentioned above that the bottom welding points of the two auxiliary supporting brackets and the welding pin of the connecting terminal are hardly arranged on the same plane, and simultaneously ensures that the welding pin of the connecting terminal and the connecting point of the circuit board are not affected by the force owing to the insertion and extraction of the electronic cards, so as to improve the connecting stability and reliability of the connector.

To achieve the above object, a card edge connector is provided, in accordance with an aspect of the present invention. The card edge connector comprises a bar insulator base which is provided with a plurality of sockets, a group of connecting terminals arrayed in parallel, and two arm supports arranged between both ends of the insulator base. The connecting terminals are inserted into the socket of the insulator base to constitute a group of socket electrodes electrically connected with a circuit board. The arm supports are respectively provided with an auxiliary supporting bracket connected to the circuit board. The auxiliary supporting brackets are mutually sheathed, articulated and connected with the arm supports.

The auxiliary supporting brackets are articulated and connected with the arm supports, through which the present card edge connector can both adjust the error between the two bottoms of the two auxiliary supporting brackets and the welding pin of the connecting terminal as well as the welding surface of the circuit board, and realize the micro-clearance matching between the auxiliary supporting brackets and the arm supports. This solves the technical problem that the bottom of the auxiliary supporting brackets and the welding pin of the connecting terminal are hardly arranged on the same plane, and simultaneously ensures effectively that the welding pin of the connecting terminal and the connecting point of the circuit do not shake owing to the influence of force generated during the insertion and extraction of the electronic card, thus improving the connecting stability and using reliability of the connector. Correspondingly, the yield of the connector is raised and the service life of the connector is prolonged.

Other objects, advantages and novel features of the present invention will become more apparent from the following detailed description when taken in conjunction with the accompanying drawings.

DETAILED DESCRIPTION OF THE PREFERRED EMBODIMENTS

Objects, advantages and embodiments of the present invention will be explained below in detail with reference to the accompanying drawings. However, it is to be appreciated that the following description of the embodiment(s) is merely exemplary in nature and is no way intended to limit the invention, its application, or uses.

Figure 1:
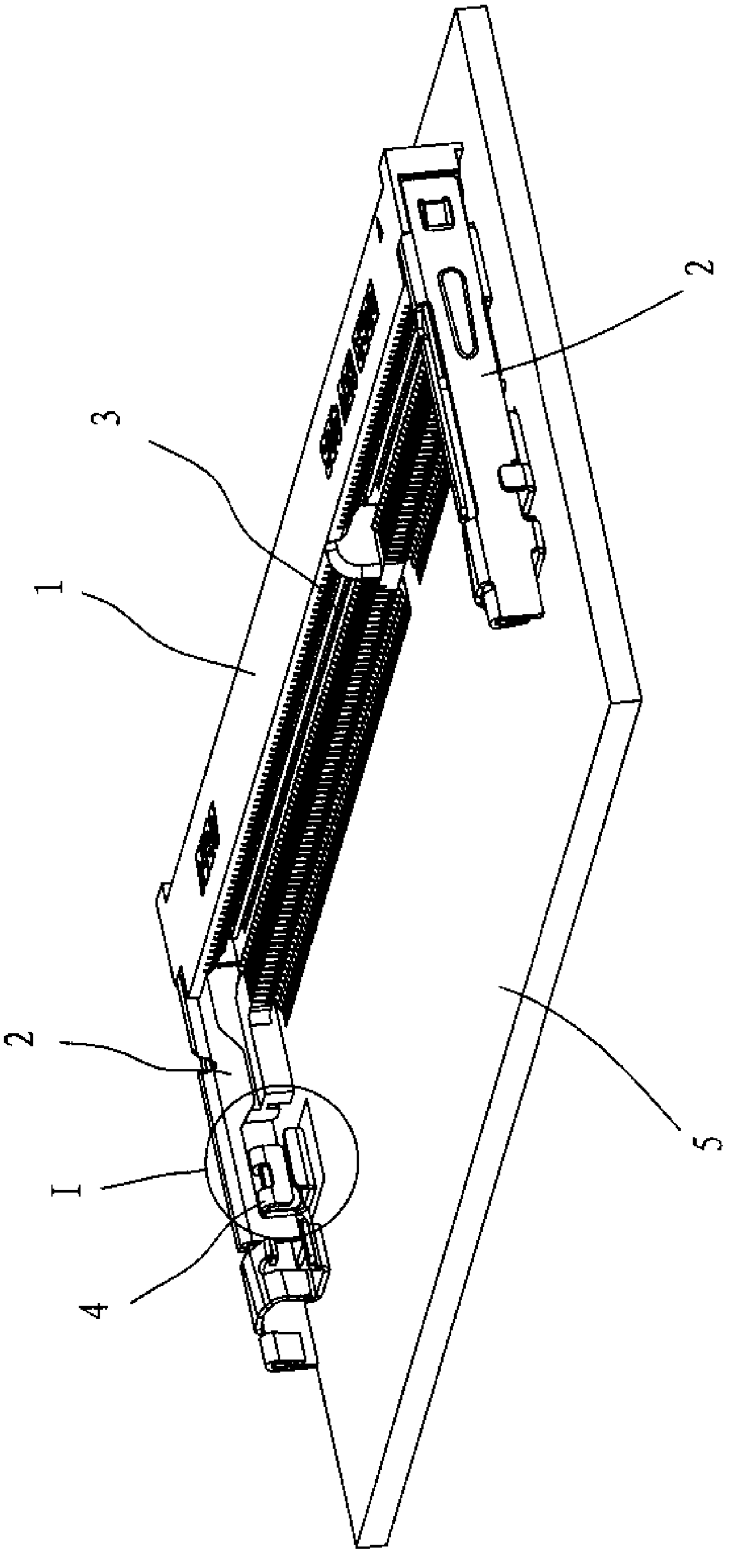
FIG. 1 is a schematic, isometric view of the connection between a card edge connector in accordance with an embodiment of the present invention and the circuit board.
Figure 2:
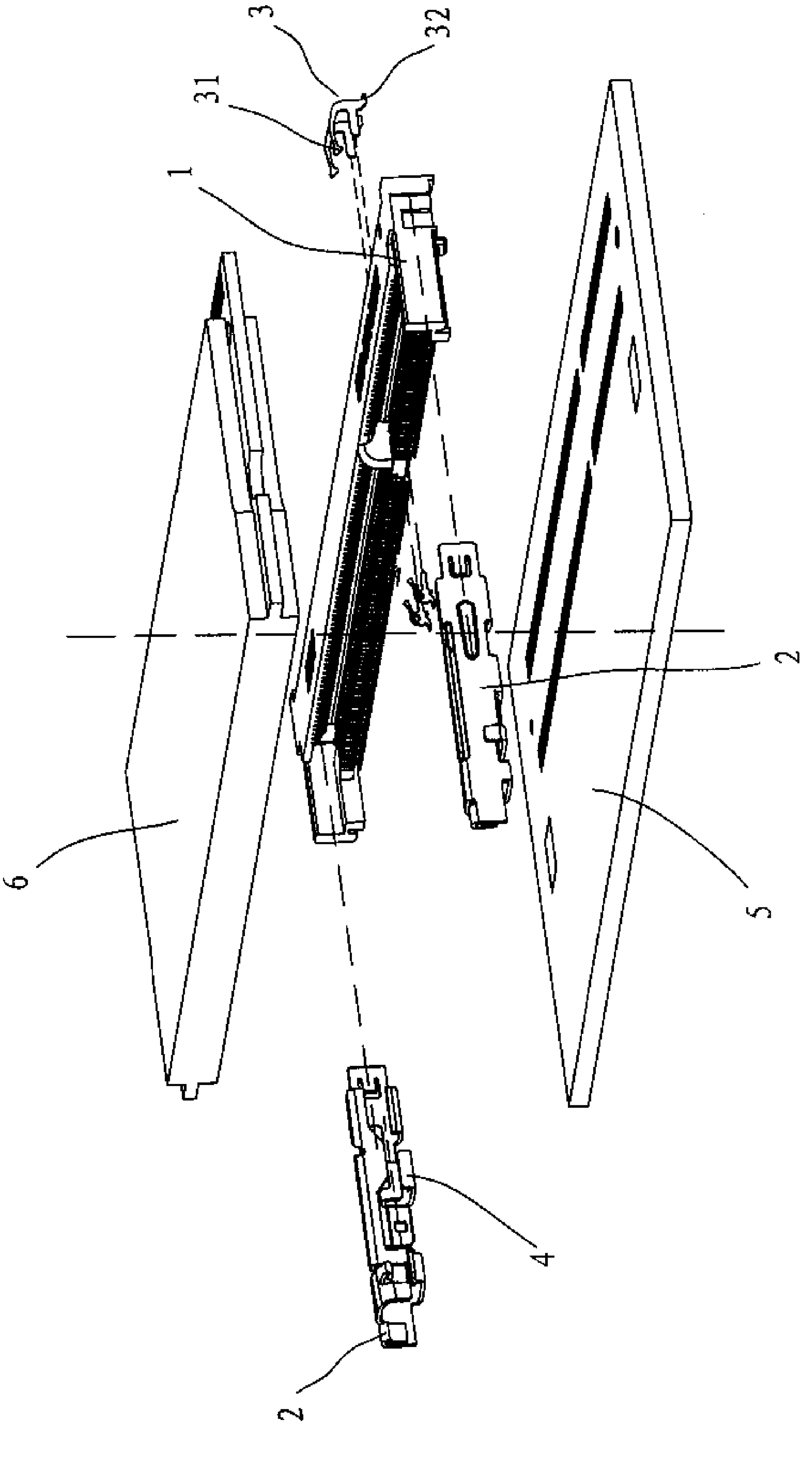
FIG. 2 is a schematic, explosive view of the card edge connector and the circuit board in FIG. 1.
Figure 3:
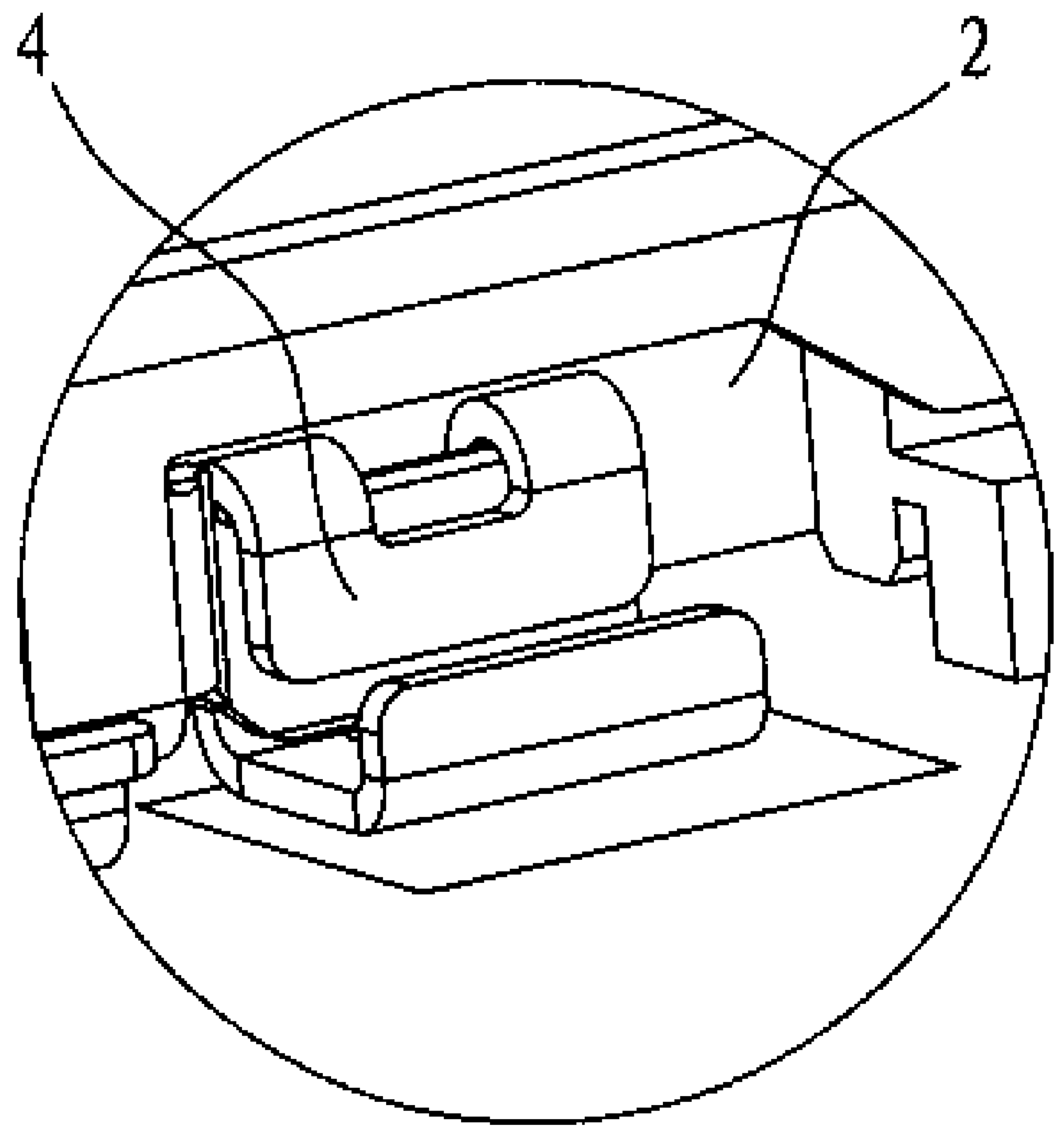
FIG. 3 is a schematic, enlarged view of part I of the connector in FIG. 1.
Figure 4:
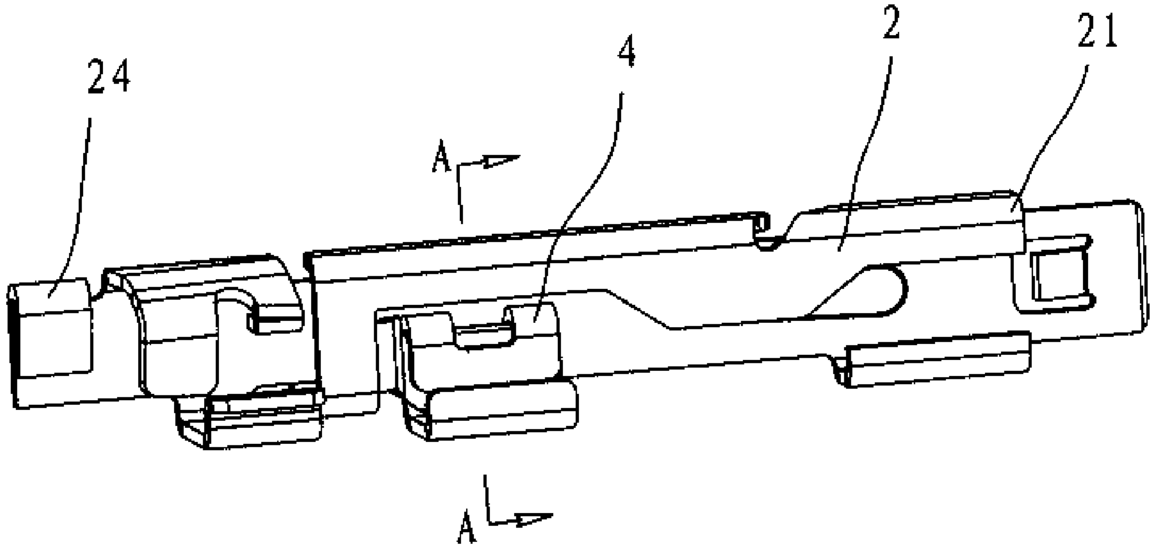
FIG. 4 is a schematic, isometric view of the connection between arm supports and the auxiliary supporting brackets of the card edge connector in FIG. 1.
Figure 5:
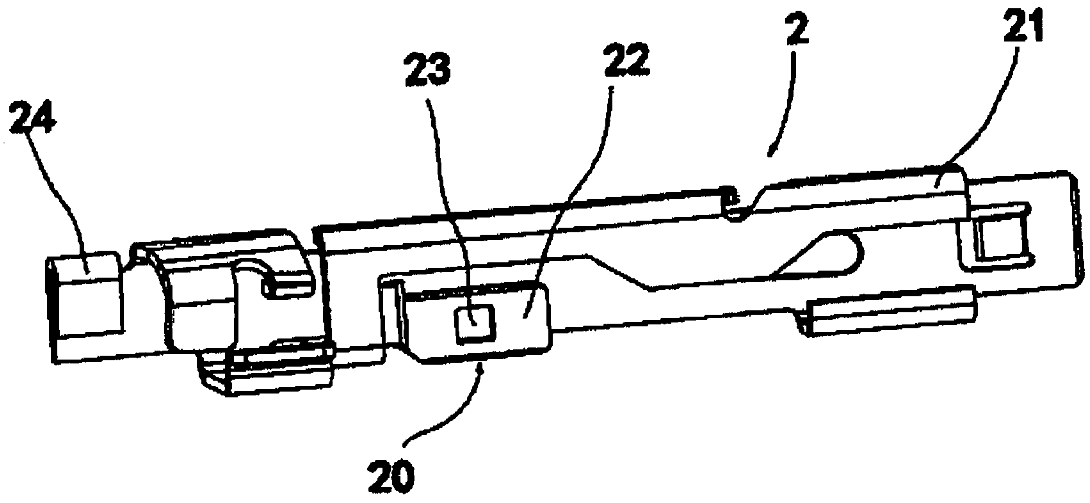
FIG. 5 is a schematic, structural view of the arm support of the card edge connector in FIG. 1.

As shown in FIG. 1 and FIG. 2, in accordance with an embodiment of the present invention, a card edge connector comprises: a bar insulator base 1 which is provided with a plurality of sockets, a group of connecting terminals 3 arrayed in parallel, and two arm supports 2 arranged between both ends of the insulator base 1. The connecting terminals 3 are respectively provided with a contact part 31 which can be arranged in the socket correspondingly arranged on the insulator base 1 for positioning thereof. A welding pin 32 is arranged at the lower end of the contact part 31 and extends out of the insulator base 1. The welding pin 32 is electrically connected with a circuit board 5 to constitute a group of socket electrodes of the connector. The electronic card 6 is inserted into the insulator base 1 at a particular angle, and revolves downwardly with the insertion end as the rotating center for positioning and locking the card 6 through the two arm supports 2. The electric connecting point of the electronic card 6 is electrically connected with the circuit board 5 through the connecting terminal 3. As shown in FIG. 4 and FIG. 5, the two arm supports 2, which are strip-shaped metal pieces, comprise a baseplate which is provided with the connecting terminal 21 and the free end 24. The connecting terminal 21 is respectively and fixedly connected with both ends of the insulator base 1. The free end 24 is provided with an elastic arm. The locking state of the electronic card 6 can be released by throwing the elastic arm so that the electronic card 6 is separated from the connector. As shown in FIGS. 1 through 4, an auxiliary supporting bracket 4 is arranged in a middle position of each arm support 2. The arm supports 2 are respectively provided with a hinge shaft 20. Each auxiliary supporting bracket 4 is mutually sheathed with the respective arm support 2 through the hinge shaft 20 and is articulated with the respective arm support 2 and rotates around the hinge shaft 20. The bottom end of each auxiliary supporting bracket 4 is provided with a welding surface connected to the circuit board 5. As the auxiliary supporting brackets 4 can rotate around the arm supports 2, the flatness error between the welding surfaces of the two auxiliary supporting brackets 4 and the welding pin 32 of the connecting terminal can be automatically eliminated. Simultaneously, the auxiliary supporting brackets 4 are mutually sheathed, articulated and connected with the arm supports 2, with the connection mutual contacting, thus forming a micro-clearance matching structure without relative up and down motion. Compared with the traditional connectors the present connector can both ensure that all the welding surfaces connected with the circuit board 5 are arranged on the same plane and ensure that the welding pin 32 on the connecting terminal 3 and the connecting point of the circuit board 5 do not shake owing to the influence of force generated by the insertion and extraction of the electronic card 6, thus improving the connecting stability and reliability of the connector and achieving the purpose of the present invention.

Figure 6:
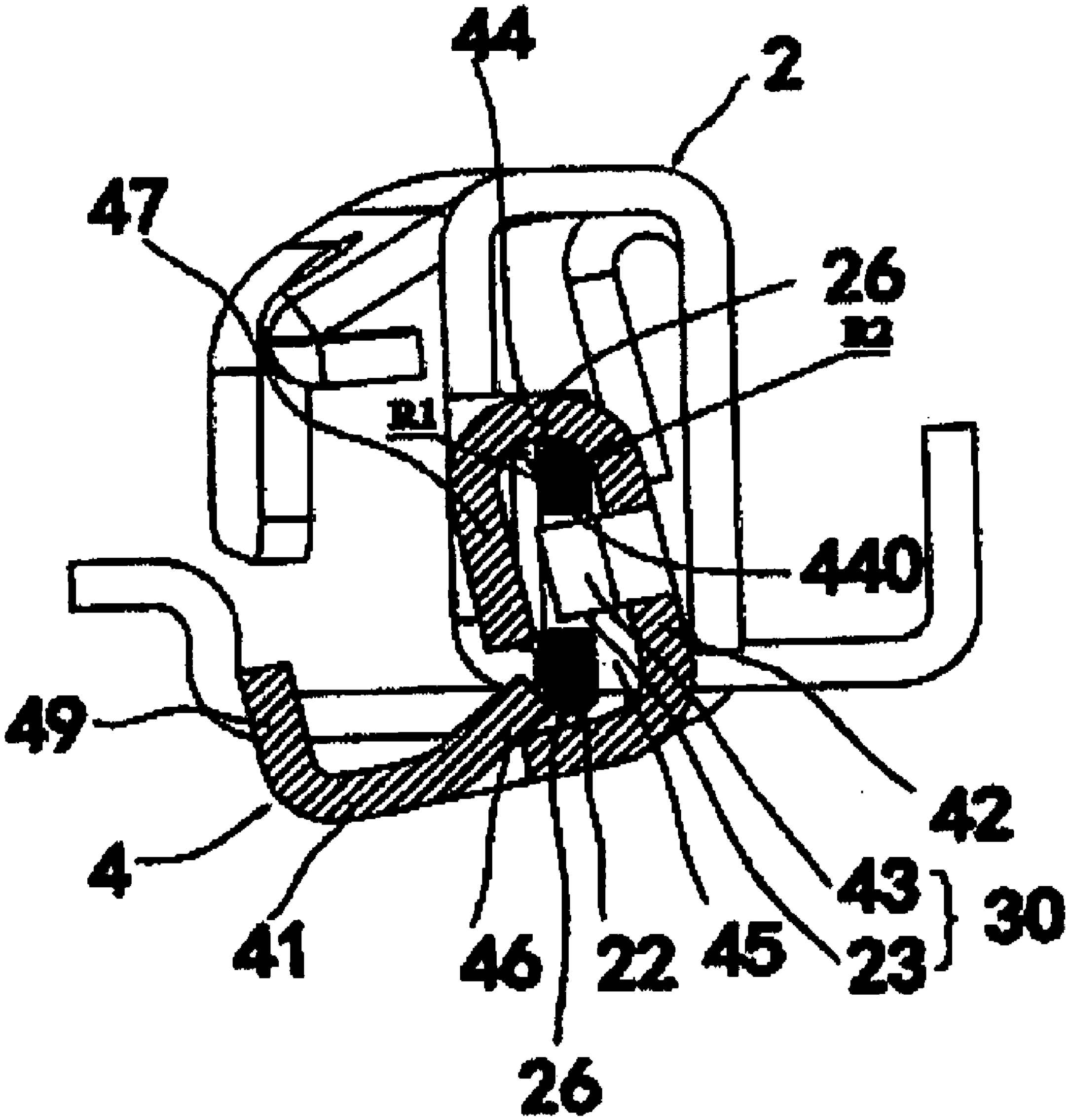
FIG. 6 is a schematic, cutaway view along the line A-A in FIG. 4.

As shown in the FIG. 5 and the FIG. 6, in a particular implementation structure of the present embodiment, the hinge shafts 20 on the arm supports 2 are the rotation shaft 22 which extend out of the relative inner sides of the two arm supports 2. Each rotation shaft 22 is a bar component and includes an upper end and a lower end respectively defining a cambered surface 26. One end of each rotation shaft is fixedly connected with the respective arm support 2. The other end of each rotation shaft is provided with an opening. Correspondingly, each auxiliary supporting bracket 4 is an elongated L-shaped component matched with the rotation shaft 22 and is provided with a bottom edge 41 welded with the circuit board 5. The outward end of the bottom edge 41 is provided with the chamfered edge 49 which can increase the accumulative amount of welding flux on the bottom of the bottom edge 41 when in welding (the welding flux can be accumulated along the chamfered edge 49) so as to improve the welding intensity. The other end of the bottom edge 41 is upwardly extended with the upright part 42. The upper end of the upright part 42 is connected to a connecting part 44 which is in a semicircular shape. The other end of the connecting part 44 is downwardly extended with the flange 47 which is parallel to the upright part 42. In this way, a space cooperatively defined by the flange 47, the connecting part 44 and the upright part 42 constitutes an elongated groove 45. The width of the groove 45 is larger than the thickness of the rotation shaft 22. When in assembly, the groove 45 is sleeved on the rotation shaft 22 from the opening of the rotation shaft 22, thereby driving the auxiliary supporting brackets 4 to rotate around the rotation shafts 22 and the auxiliary supporting brackets 4 are mutually articulated and connected with the arm supports 2. In the embodiment, the rotation shafts 22 adopt a strip structure, which has two advantages: on one hand, the rotation shafts 22 can be matched with the arm supports 2. On the other hand, the rotation shafts 22 can ensure the longitudinal stability of the auxiliary supporting brackets 4.

As shown in the FIG. 6, the upper end and the lower end of each rotation shaft 22 respectively contact with an internal superface of the connecting part 44 of the respective auxiliary supporting bracket 4 and an upper surface of the bottom edge 41. The matching surface at the upper end of the connecting part 44 and the rotation shaft 22 is also a cambered surface 440, and the radius R1 of the cambered surface 440 of the connecting part 44 is larger than the radius R2 of the upper head face of the rotation shaft 22. In this way, a contact point always contacts with the connecting part 44 and the rotation shaft 22, and the matching structure of the cambered surface facilitates the free rotation of the auxiliary supporting bracket 4.

Figure 7:
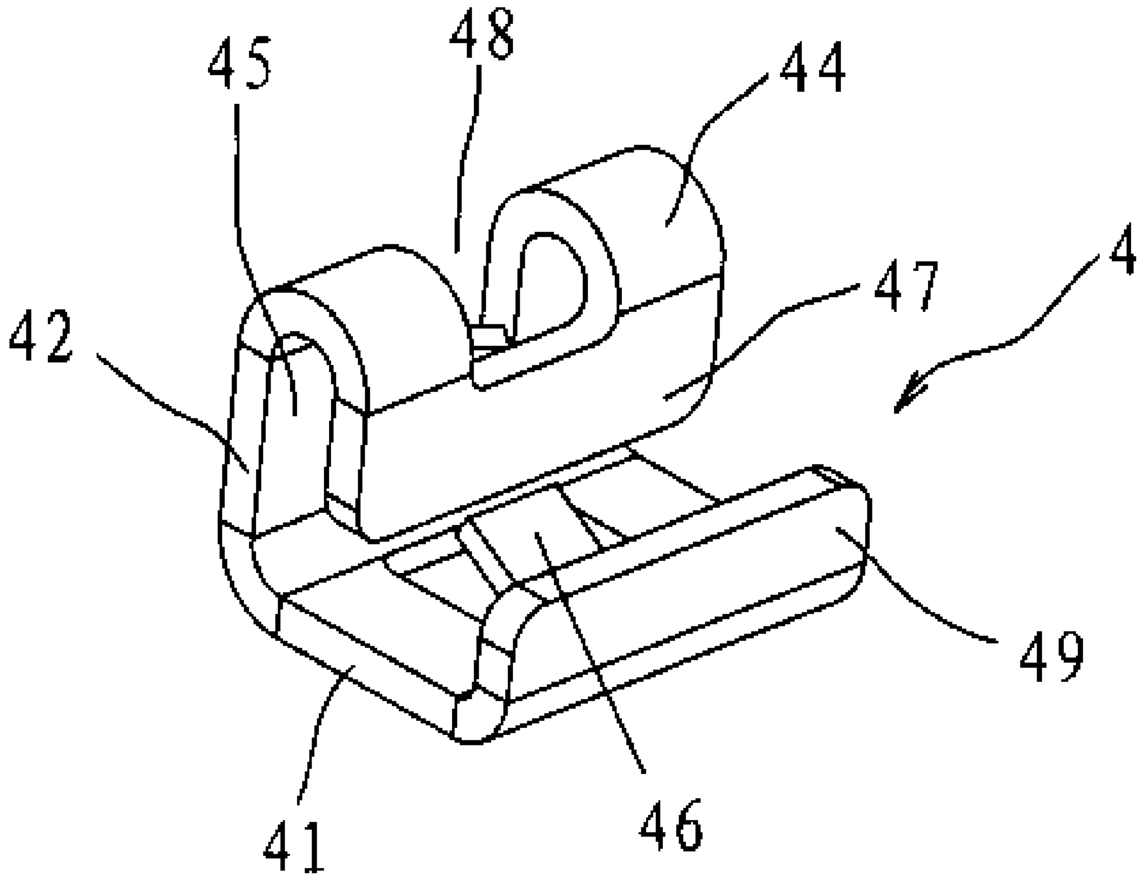
FIG. 7 is a schematic view of the auxiliary supporting bracket of the card edge connector in FIG. 1.
Figure 8:
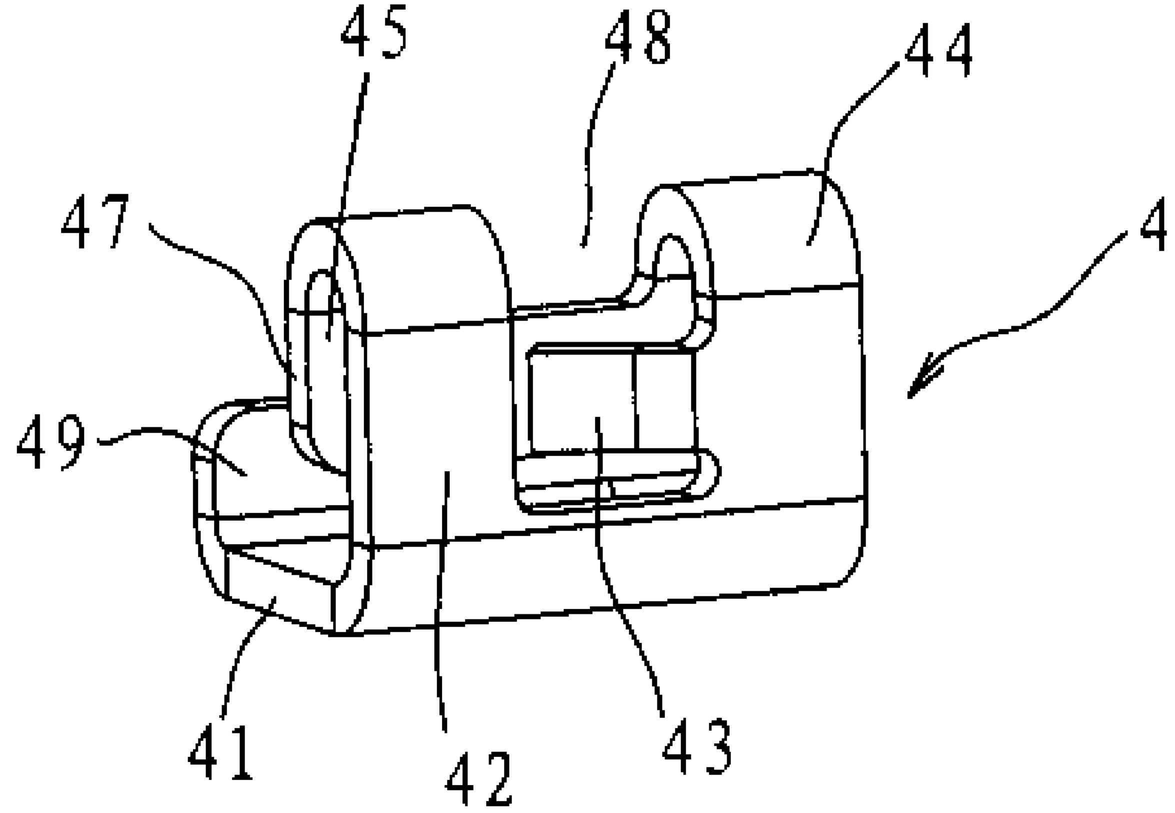
FIG. 8 is a schematic view of an alternative auxiliary supporting bracket of the card edge connector in FIG. 1.

As shown in the FIG. 6 and FIG. 7, in order to further restrict the up and down motion of the auxiliary supporting brackets 4 and excessive rotation of the rotation shafts 22, the bottom edge 41 of each auxiliary supporting bracket 4 is upwardly extended with the elastic locking tongue piece 46. The elastic locking tongue piece 46 is provided with an oblique bulge formed by stamping on the bottom edge of the auxiliary supporting bracket 4. The top surface or the bulge contacts with the cambered surface 26 at the lower end of the rotation shaft 22. When rotating to a certain angle, each auxiliary supporting bracket 2 can be held by the elastic locking tongue piece 46 so as to ensure the relative stability between the arm supports 2 and the auxiliary supporting brackets 4.

Further, a gripping mechanism 30 is arranged at the relative position between each auxiliary supporting bracket 4 and the respective arm support 2, for restricting the longitudinal displacement of each auxiliary supporting bracket 4 along the arm support 2. As shown in FIGS. 5, 6, and 7, each gripping mechanism 30 comprises a locking hole 23 arranged on the rotation shaft 22 and an anti-retreating elastic tongue piece 43 which is formed by stamping and is stuck in the locking hole 23. The bottom of the anti-retreating elastic tongue piece 43 is disposed on an internal wall of the upright part 42 on the auxiliary supporting bracket 4. The top of the anti-retreating elastic tongue piece 43 obliquely extends into the groove 45 along an installation direction of the auxiliary supporting bracket 4 (i.e., a longitudinal direction of the arm support 2), thereby forming an oblique sheet component corresponding to the locking hole 23. After the auxiliary supporting brackets 4 are installed on the respective rotation shafts 22, a top of the elastic locking tongue pieces 46 can be blocked into the locking hole 23 so as to prevent the auxiliary supporting brackets 4 from loosening in the rotation. Accordingly, the stability of the connection between the auxiliary supporting brackets 4 and the arm supports 2 is further improved.

Additionally, in each auxiliary supporting bracket 4, a vertical cut 48 is defined between the connecting part 44 and the upright part 42. This structure, on one hand, facilitates the processing of the elastic locking tongue piece 46, on the other hand, reduces contact area between the respective rotation shaft 22 and the respective connecting part 44. In this way, each rotation shaft 22 better contact with the connecting part 44 and the rotation between the rotation shaft 22 and the connecting part 44 is smoother.

In an alternative gripping mechanism, each rotation shaft 22 could be also provided with an identical elastic locking tongue piece. When the auxiliary supporting brackets 4 is installed on the rotation shaft 22, the top of the elastic locking tongue piece 46 can be blocked into the cut 48 of the upright part 42. This can also realize the anti-retreating function of the auxiliary supporting bracket 4.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A card edge connector comprises:

a bar insulator base provided with a plurality of sockets;

a group of connecting terminals arrayed in parallel;

two arm supports arranged between both ends of the insulator base; and a rotation shaft extending out of relatively an inner side of each arm support, the rotation shaft constituting a hinge shaft through which each auxiliary supporting bracket is articulated and connected with the respective arm support, each auxiliary supporting bracket being correspondingly provided with a groove sheathed with the respective rotation shaft to cause relative rotation of each auxiliary supporting bracket and the respective arm support, wherein the connecting terminals are inserted into the sockets of the insulator base to constitute a group of socket electrodes electrically connected with a circuit board, the two arm supports being respectively provided with an auxiliary supporting bracket connected with the circuit board; and wherein each auxiliary supporting bracket is mutually sheathed, articulated and connected with one respective arm support.

2. The card edge connector according to claim 1, wherein each auxiliary supporting bracket is provided with a bottom edge welded with the circuit board, the bottom edge being upwardly extended with an upright part which is connected to one end of a connecting part, another end of the connecting part being downwardly extended with a flange, a space being defined among the flange, the connecting part and the upright part, the space constituting the groove.

3. The card edge connector according to claim 2, wherein the rotation shaft is a strip-shaped component, an upper end and a lower end of the rotation shaft being respectively provided with a cambered surface, the rotation shaft being respectively contacting with an internal superface of the connecting part and an upper surface of the bottom edge in the auxiliary supporting bracket, a matching surface between the connecting part and the upper end of the rotation shaft being a cambered surface.

4. The card edge connector according to claim 3, wherein the bottom edge of each auxiliary supporting bracket is upwardly extended with an elastic locking tongue piece, a top of the elastic locking tongue piece contacting with the lower end of the rotation shaft.

5. The card edge connector according to claim 3, wherein a radius of a cambered surface of the connecting part is larger than a radius of the cambered surface on the upper end of the rotation shaft.

6. The card edge connector according to claim 3, wherein a vertical cut is defined between the connecting part and the upright part.

7. A card edge connector comprising:

a bar insulator base provided with a plurality of sockets;

a group of connecting terminals arrayed in parallel;

two arm supports arranged between both ends of the insulator base; and a gripping mechanism arranged at corresponding position of each auxiliary supporting bracket and the respective arm support, the gripping mechanism being configured for restricting a longitudinal displacement of the auxiliary supporting bracket along the respective arm support, wherein the connecting terminals are inserted into the sockets of the insulator base to constitute a group of socket electrodes electrically connected with a circuit board, the two arm supports being respectively provided with an auxiliary supporting bracket connected with the circuit board;

wherein each auxiliary supporting bracket is mutually sheathed, articulated and connected with one respective arm support; and wherein the gripping mechanism comprises a locking hole arranged on a rotation shaft and an anti-retreating elastic tongue piece stuck in the locking hole.

8. The card edge connector according to the claim 7, wherein a bottom of the anti-retreating elastic tongue piece is arranged on an internal wall of the upright part, a top of the anti-retreating elastic tongue piece obliquely extending into the groove along an installation direction of the auxiliary supporting bracket.

* * * * *